United States Patent
Yagisawa

(10) Patent No.: US 8,655,119 B2
(45) Date of Patent: Feb. 18, 2014

(54) CONNECTION DEVICE AND OPTICAL DEVICE

(75) Inventor: Takatoshi Yagisawa, Kawasaki (JP)

(73) Assignee: Fujitsu Optical Components Limited, Kawasaki (JP)

( * ) Notice: Subject to any disclaimer, the term of this patent is extended or adjusted under 35 U.S.C. 154(b) by 75 days.

(21) Appl. No.: 12/923,259

(22) Filed: Sep. 10, 2010

(65) Prior Publication Data

US 2011/0008056 A1    Jan. 13, 2011

Related U.S. Application Data

(63) Continuation of application No. PCT/JP2008/054388, filed on Mar. 11, 2008.

(51) Int. Cl.
*G02B 6/12*    (2006.01)
*G02B 6/36*    (2006.01)

(52) U.S. Cl.
USPC ............. 385/14; 385/88; 385/89; 385/92

(58) Field of Classification Search
USPC ............ 385/14, 88, 89, 92; 439/67; 261/749, 261/772, 776
See application file for complete search history.

(56) References Cited

U.S. PATENT DOCUMENTS

| | | | |
|---|---|---|---|
| 3,764,955 A | 10/1973 | Ward | |
| 6,378,757 B1 | 4/2002 | Holcombe et al. | |
| 2003/0063872 A1* | 4/2003 | Govan Date et al. | 385/92 |
| 2003/0103740 A1* | 6/2003 | Edwards et al. | 385/94 |
| 2004/0264882 A1 | 12/2004 | Torigoe et al. | |
| 2005/0018994 A1 | 1/2005 | Riaziat et al. | |
| 2007/0126524 A1 | 6/2007 | Yagisawa | |
| 2007/0285740 A1 | 12/2007 | Onishi et al. | |
| 2010/0285676 A1* | 11/2010 | Ikeuchi et al. | 439/65 |

FOREIGN PATENT DOCUMENTS

| | | |
|---|---|---|
| JP | 62-155596 | 7/1987 |
| JP | 63-56002 | 3/1988 |
| JP | 4-18787 | 1/1992 |
| JP | 8-203577 | 8/1996 |
| JP | 2004-64459 | 2/2004 |
| JP | 2005-26801 | 1/2005 |
| JP | 2005-243970 | 9/2005 |
| JP | 2006-332280 | 12/2006 |
| JP | 2007-158856 | 6/2007 |

OTHER PUBLICATIONS

Mitsubishi Electric Corporation, "XMD-MSA-Based 10Gps Modulator Integrated Semiconductor Laser (EA-LD) Module," 3pp, Aug. 21, 2007, http://www.mitsubishichips.com/Japan/new_pro/no.118/p18_1.html.
International Search Report for PCT/JP2008/054388, mailed May 13, 2008.
Written Opinion of the International Searching Authority (Form PCT/ISA/237) for PCT/JP2008/054388.
Extended European Search Report mailed Feb. 4, 2013 in corresponding PCT Application No. 08721804.6.
Chinese Office Action issued in corresponding Chinese Patent Application 200880127977.2 issued on Dec. 18, 2012.

* cited by examiner

*Primary Examiner* — Ryan Lepisto
(74) *Attorney, Agent, or Firm* — Staas & Halsey LLP

(57) ABSTRACT

A connection device includes a ground electrode layer that is provided in a substrate, a first transmission path that is provided on the ground electrode layer via a dielectric layer, and a plurality of leads that are connected to the first transmission path and the ground electrode layer or the first transmission path and a plane that is electrically connected to the ground electrode layer. The plurality of leads are fitted into through-holes that are provided in a second transmission path and a ground electrode on a flexible substrate to be electrically connected.

18 Claims, 22 Drawing Sheets

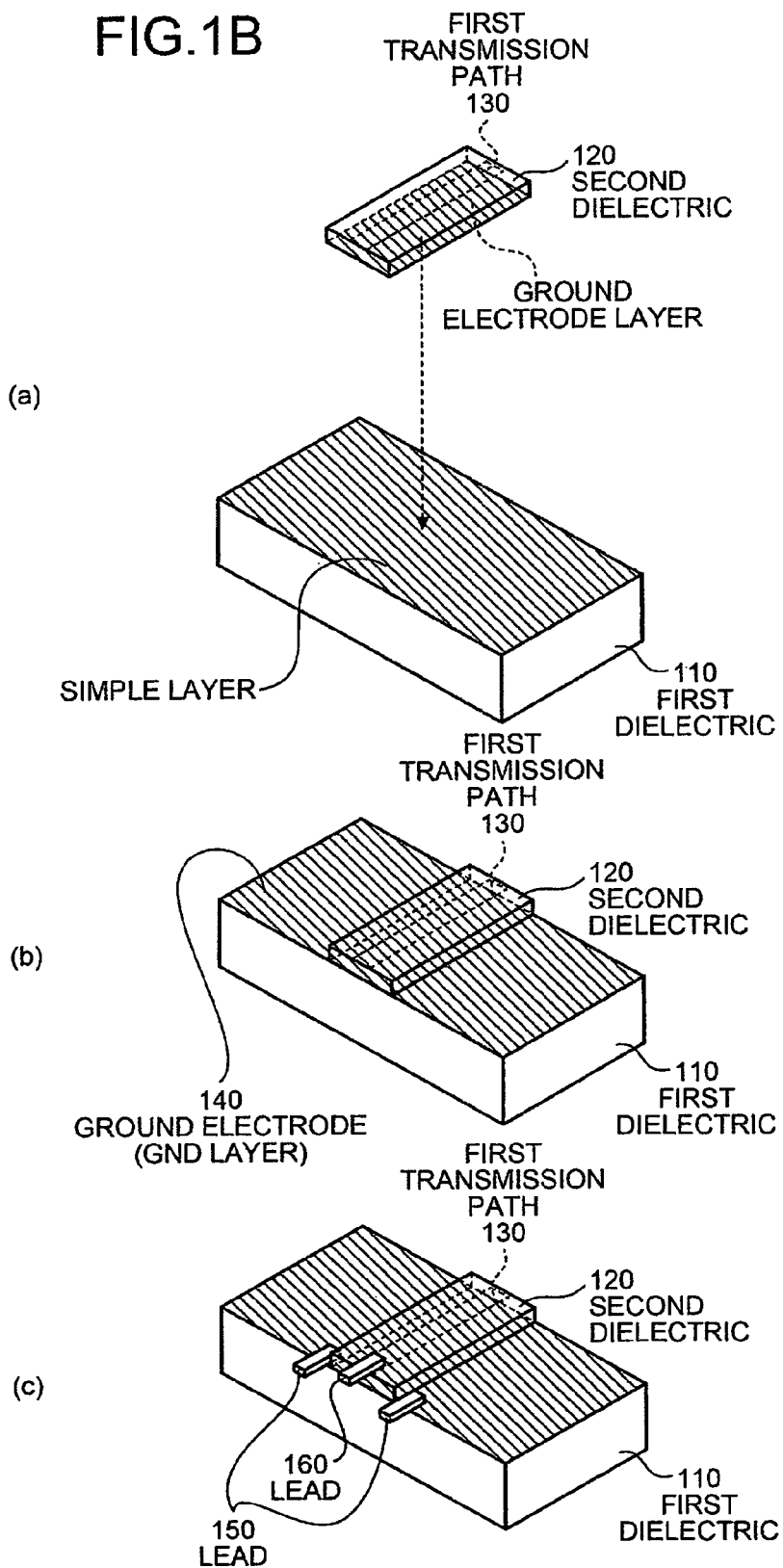

CD CROSS SECTION

AB CROSS SECTION

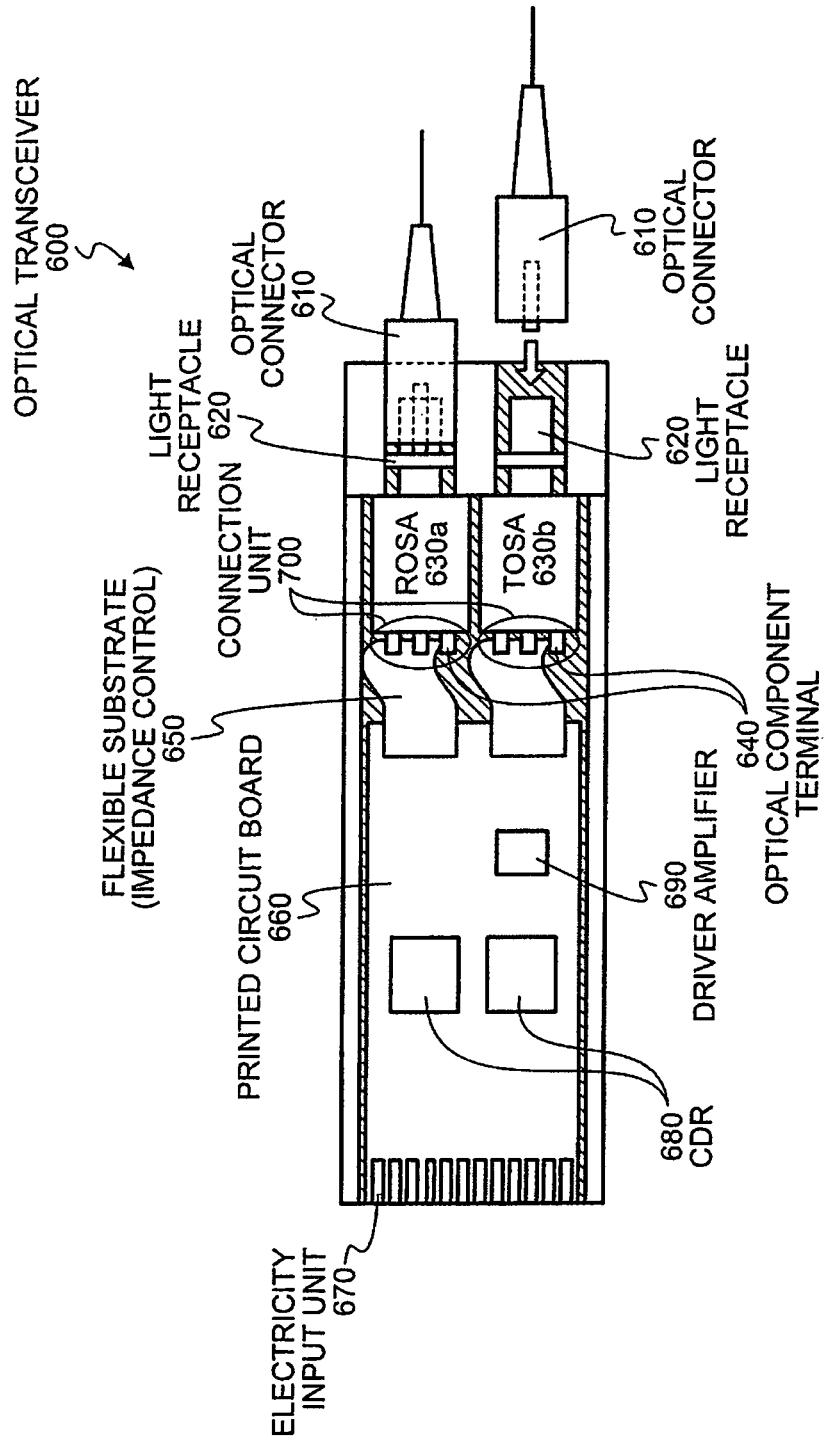

FIG.15
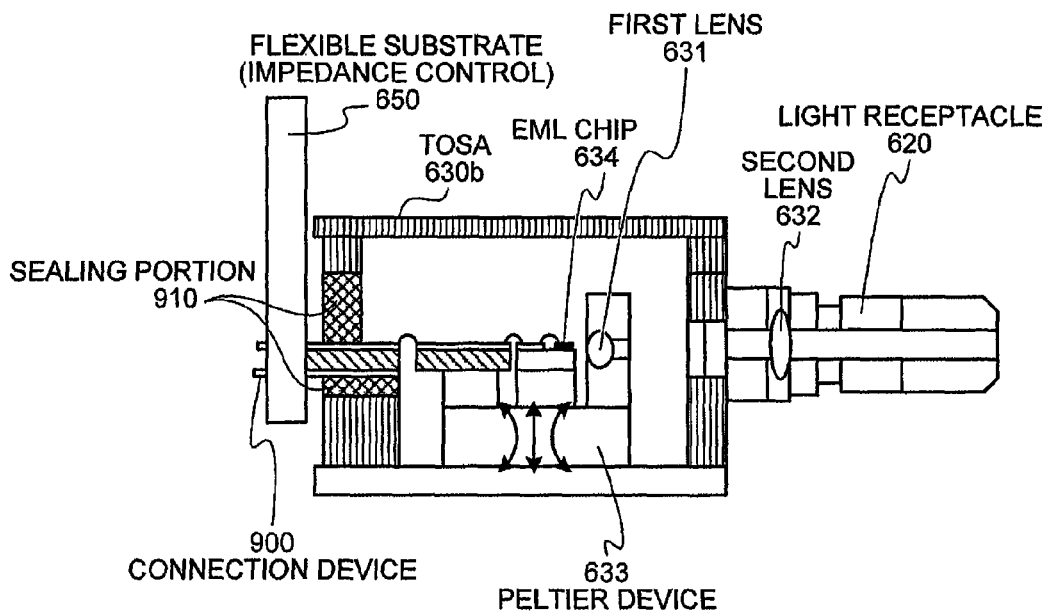
RELATED ART FIG.16
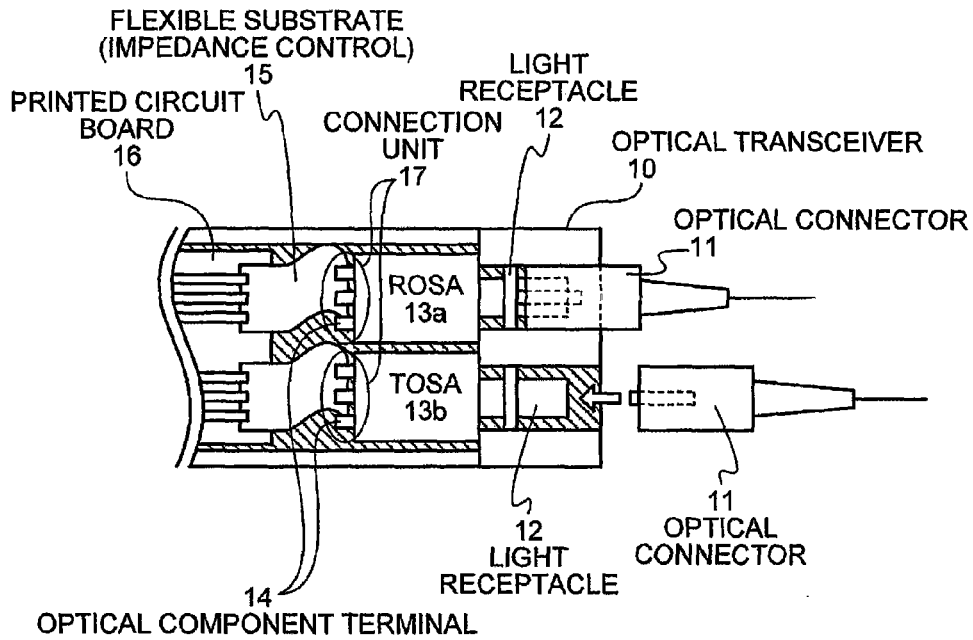

CONNECTION DEVICE AND OPTICAL DEVICE

CROSS-REFERENCE TO RELATED APPLICATION

This application is a continuation of International Application No. PCT/JP2008/054388, filed on Mar. 11, 2008, the entire contents of which are incorporated herein by reference.

FIELD

The embodiments discussed herein are directed to a connection device that connects a flexible substrate and an optical device.

BACKGROUND

An optical device that is being used in an optical communication system is increasingly miniaturized and is increasingly produced at low cost. For example, in a 10 Gbps optical transceiver, the standard of a small-sized and low-power optical transceiver becomes general as represented by X2 and XFP (10 Giga-bit Small Form Factor Pluggable).

Along with that, the miniaturization of an electro-optical converting unit and a photo-electric converting unit that are used in the optical transceiver is also being advanced. Therefore, the miniaturization standard of TOSA (Transmitter Optical Sub Assembly) and ROSA (Receiver Optical Sub Assembly) becomes general as represented by XMD-MSA (Miniature Device Multi Source Agreement).

In the TOSA and ROSA, an optical component and a printed circuit board are generally connected by a flexible substrate. FIG. 16 is a diagram illustrating the configuration of a conventional optical transceiver 10 that includes flexible substrates. As illustrated in FIG. 16, the optical transceiver 10 includes light receptacles 12, and a ROSA 13a, a TOSA 13b, optical component terminals 14, flexible substrates 15, and a printed circuit board 16.

The optical transceiver 10 performs optical coupling by fitting optical connectors 11 into the light receptacles 12. The positional accuracy for fitting the optical connector 11 into the light receptacle 12 should be generally not more than 100 micrometers. Therefore, optical components such as the TOSA 13b or the ROSA 13a are fixedly arranged in the optical transceiver 10 by using the position of the light receptacle 12 as a standard. Alternatively, the TOSA 13b and the ROSA 13a may not be fixed in the optical transceiver 10 in such a manner that the TOSA and ROSA move to positions at which they are matched with connectors to be inserted.

By arranging the TOSA 13b and the ROSA 13a in the optical transceiver 10 by using the position of the light receptacle 12 as a standard, positional misalignment occurs between the optical component terminals 14 and the printed circuit board 16 due to a contour tolerance and a location tolerance of the ROSA 13a, the TOSA 13b, and the printed circuit board 16. In a connection unit of the optical component terminal 14 and the printed circuit board 16, a connection terminal should be shaped and connected to the printed circuit board 16 due to the positional misalignment in such a manner that the connection terminal is matched with a connection pad position of the printed circuit board 16 by lengthening the connection terminal. Therefore, the characteristic of a high-frequency signal may be degraded and a short may occur between a signal line and a power supply. The relaxation of positional misalignment and the maintenance measures of high frequency characteristic can be performed by using the flexible substrate 15 of which the impedance is controlled.

Moreover, a connection unit 17 in which the optical components (the ROSA 13a and the TOSA 13b), the optical component terminals 14, the flexible substrates 15, and the like are connected has various configurations (for example, see Japanese Laid-open Patent Publication No. 2007-158856 and Mitsubishi Electric Corporation, "XMD-MSA-based 10 Gbps modulator integrated semiconductor laser (EA-LD) module", [Online], [Aug. 21, 2007], <URL:http://www.mitsubishichips.com/Japan/new_pro/no.118/p18_1.html>).

FIGS. 17 and 18 are diagrams illustrating the configuration of a conventional connection unit.

As an example, in a connection unit 20 illustrated in FIG. 17, leads 26 are connected to surface patterns (a high-frequency transmission path 22, surface GNDs 23, and DC terminals 25) of a multilayer ceramic substrate 21, and the leads 26 are inserted into through-holes 28 of a flexible substrate 27 to be connected by solder.

As an example, in a connection unit 30 illustrated in FIG. 18, flying leads 37 of a flexible substrate 36 are electrically connected to surface patterns (a high-frequency transmission path 32, surface GNDs 33, and DC terminals 35) of a multilayer ceramic substrate 31 by using bonding.

However, the conventional art has a problem in that high frequency characteristics are degraded due to discontinuous GNDs and high frequency characteristics are degraded in a transmission path and GNDs as explained below. In a cross-sectional view of the high-frequency transmission path 22 of FIG. 17, electric lines of force of between the signal line and the GNDs are thickly generated to an inner-layer (lower-layer) GND 24 as illustrated in FIG. 19. In the connection method illustrated in FIG. 17, only the surface GNDs 23 of the transmission line are connected to the GND layer of the flexible substrate 27. Because the inner-layer (lower-layer) GND 24 that has thick electric lines of force cannot be directly connected to the GND of the flexible substrate 27 but is connected to the GND through via holes 29, a transmission line becomes discontinuous and thus high frequency characteristics are degraded in the case of a high frequency signal.

It is considered that the gap between the high-frequency transmission path 32 and the surface GNDs 33 is reduced as illustrated in FIG. 18 and the transmission line is formed so that electric lines of force between the signal line and the GNDs are thickly generated at the side of the surface GNDs 33 as illustrated in FIG. 20. When the connection method of FIG. 18 is performed, because the connection of the leads 26 as in FIG. 17 is spatially difficult by reducing the gap between the high-frequency transmission path 32 and the surface GNDs 33, the flexible substrate 36 is directly connected to the high-frequency transmission path 32, or is connected to the high-frequency transmission path 32 by using the flying leads 37 as in FIG. 18. In this case, the discontinuity of a signal line caused by the leads is canceled, and thus high frequency characteristics can be secured by connecting only the surface GNDs. However, to satisfy about 40 GHz high frequency characteristics, it is necessary to keep the gap between the high-frequency transmission path 32 and the surface GNDs 33 less than or equal to 100 micrometers. Therefore, the connection between the flexible substrate 36 and the high-frequency transmission path 32 requires a positional accuracy of about several dozen micrometers. Moreover, the connection unit of the flexible substrate cannot secure sufficient connection strength, and thus the flexible substrate or the flying leads may be damaged.

SUMMARY

According to an aspect of an embodiment of the invention, a connection device includes a ground electrode layer that is provided in a substrate; a first transmission path that is provided on the ground electrode layer via a dielectric layer; and a plurality of leads that are connected to the first transmission path and the ground electrode layer or the first transmission path and a plane that is electrically connected to the ground electrode layer, wherein the plurality of leads are fitted into through-holes that are provided in a second transmission path and a ground electrode on a flexible substrate to be electrically connected.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF THE DRAWINGS

FIGS. 1A and 1B are diagrams explaining the concept of a connection device according to a first embodiment;

FIG. 9 is a diagram illustrating a configuration example of an optical transceiver;

FIG. 15 is a diagram illustrating an example of connecting the connection device including a sealing portion to an optical device;

FIG. 16 is a diagram illustrating the configuration of a conventional optical transceiver that includes a flexible substrate;

DESCRIPTION OF EMBODIMENTS

Preferred embodiments of the present invention will be explained with reference to accompanying drawings. The present invention is not limited to the embodiments explained below.

[a] First Embodiment

It will be explained about the brief of a connection device according to the first embodiment. FIGS. 1 to 3 are diagrams explaining the concept of a connection device according to the first embodiment. FIG. 1 illustrates the brief of a dielectric substrate 100 in the connection device. FIG. 2 illustrates the brief of a flexible substrate in the connection device. FIG. 3 illustrates an example of the connection device by which the dielectric substrate and the flexible substrate are connected.

Figure 1A:
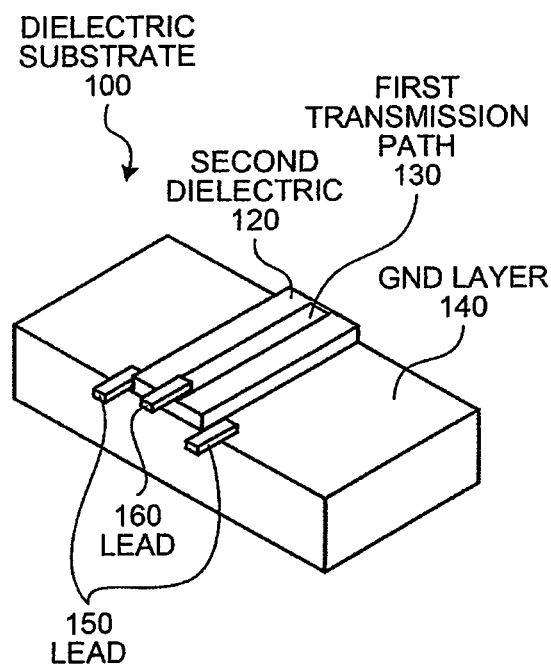

First, it will be explained about the left side of FIG. 1A. In the dielectric substrate 100 illustrated in FIG. 1A, a GND layer 140 is provided on the top face of a first dielectric 110. In FIG. 1A, the GND layer 140 is arranged on the entire face of the dielectric substrate. However, the GND layer 140 may be partially arranged on the dielectric substrate. Moreover, the dielectric substrate may be a metal substrate.

A second dielectric 120 is provided on the top face of the GND layer 140, and a first transmission path 130 is provided on the top face of the second dielectric 120. The materials of the first transmission path 130 are ceramic materials such as alumina ceramics or glass ceramics, or PCB materials such as Teflon (registered trademark), glass epoxy, or PTFE, and the like.

Leads 150 are connected to the GND layer 140 and a lead 160 is connected to the first transmission path 130. The leads 150 and 160 are metal such as Kovar or copper of which the thickness is about 100 micrometers. The leads 150 are a lead for the connection of a ground and the lead 160 is a lead for the connection of a signal line.

As illustrated in FIGS. 1B to 1D, in the second dielectric 120, the opposite face of a face on which the first transmission path 130 is disposed is a ground electrode layer. By coupling the ground electrode layer of the second dielectric 120 and a conductor layer of the first dielectric 110, the top face of the first dielectric 110 becomes the ground electrode (the GND layer 140) of the first transmission path.

Figure 2A:
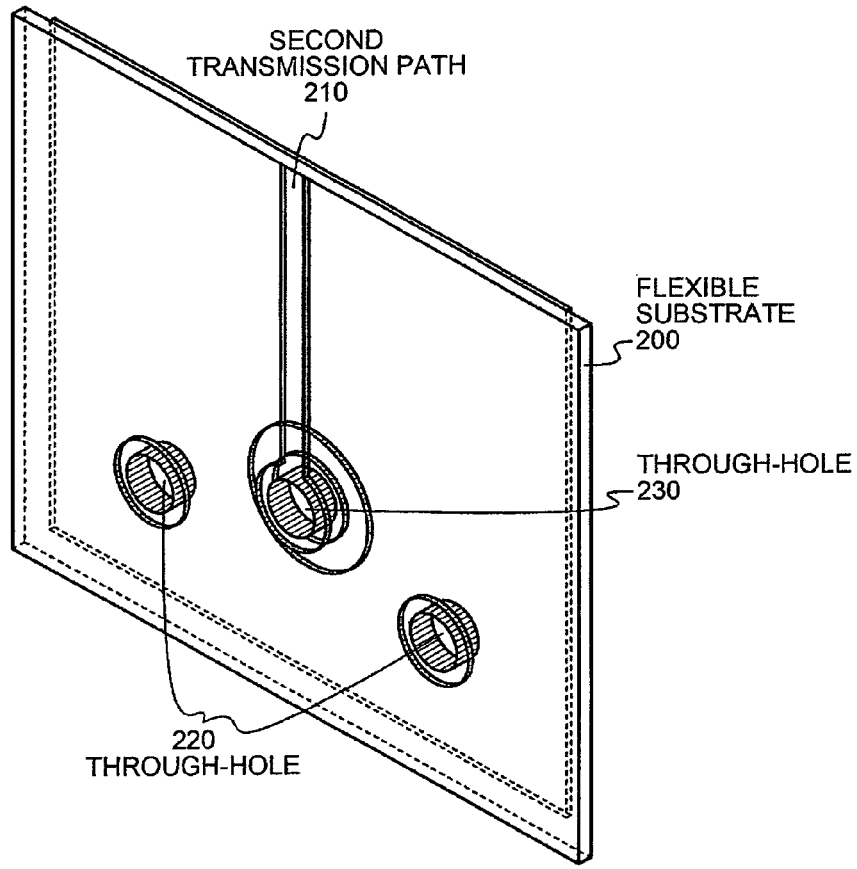
FIGS. 2A to 2D are diagrams explaining the concept of the connection device according to the first embodiment.
Figure 2B:
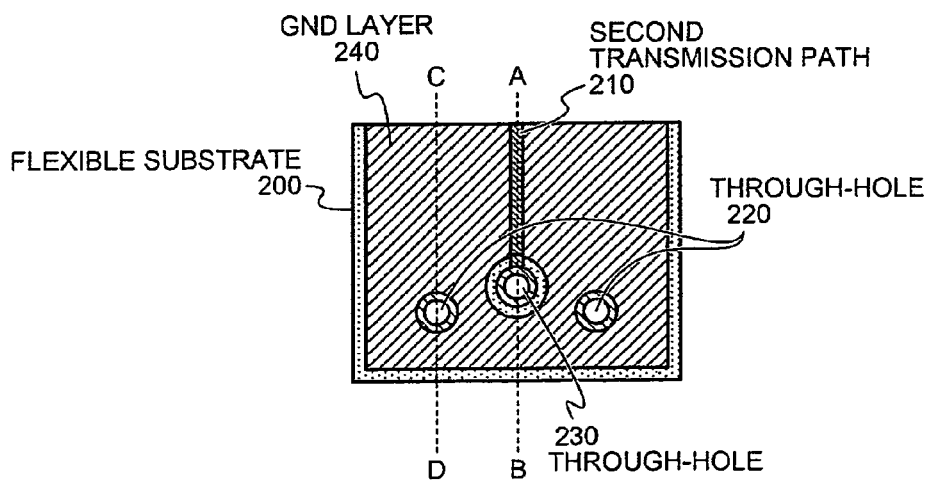

Next, it will be explained about FIGS. 2A to 2D. FIG. 2A is a perspective diagram of a flexible substrate 200. FIG. 2V is a front view of the flexible substrate 200. Furthermore, FIGS. 2C and 2D are the CD cross section and AB cross section of the flexible substrate 200, respectively.

As illustrated in FIG. 2A, a second transmission path 210 is provided on the surface of the flexible substrate 200. The materials of the second transmission path 210 are flexible-substrate materials such as polyimide, liquid crystal polymer, or plastic. Moreover, the flexible substrate 200 includes through-holes 220 into which the leads 150 for the connection of a ground are inserted and a through-hole 230 into which the lead 160 for the connection of a signal line is inserted.

Figure 2C:
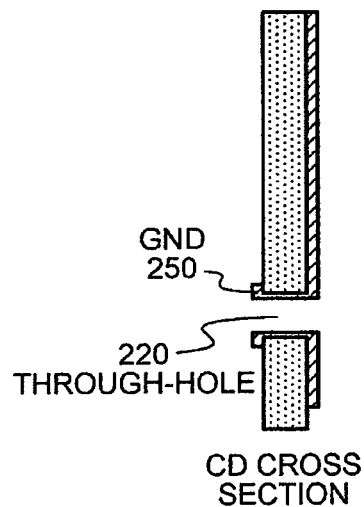
Figure 2D:
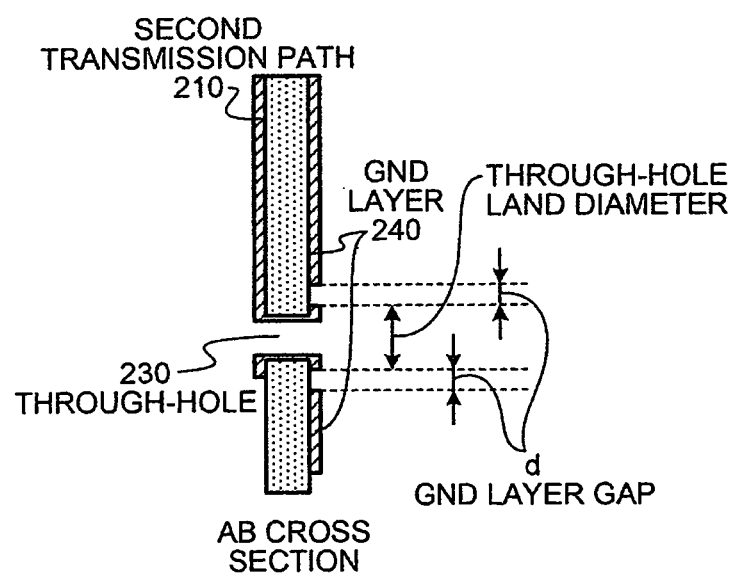

FIGS. 2C and 2D are configuration examples of a flexible substrate. In the flexible substrate 200, the second transmission path 210 is provided on the opposite face of a face on which a GND layer 240 is provided. Moreover, the inside of each the through-hole 220 becomes a GND 250 and the inside of the through-hole 230 is electrically connected to the second transmission path 210. Moreover, in the AB cross section, the gap "d" of the GND layer becomes 30 micrometers to 150 micrometers.

The flexible substrate 200 has a signal line and a ground. If the flexible substrate has a transmission line of which the impedance is controlled, the shape of the transmission line can be freely changed. Moreover, the flexible substrate 200 may have an insulating layer on the surface of the second transmission path 210 or one or both of the surfaces of the ground electrode layer.

Figure 3A:
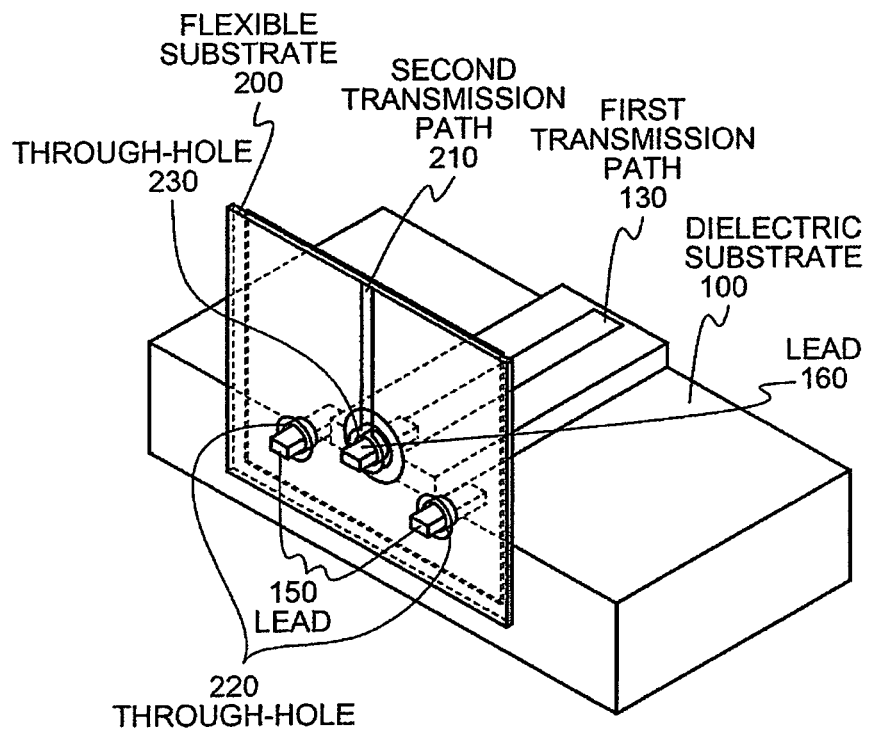
FIGS. 3A to 3D are diagrams explaining the concept of the connection device according to the first embodiment.
Figure 3B:
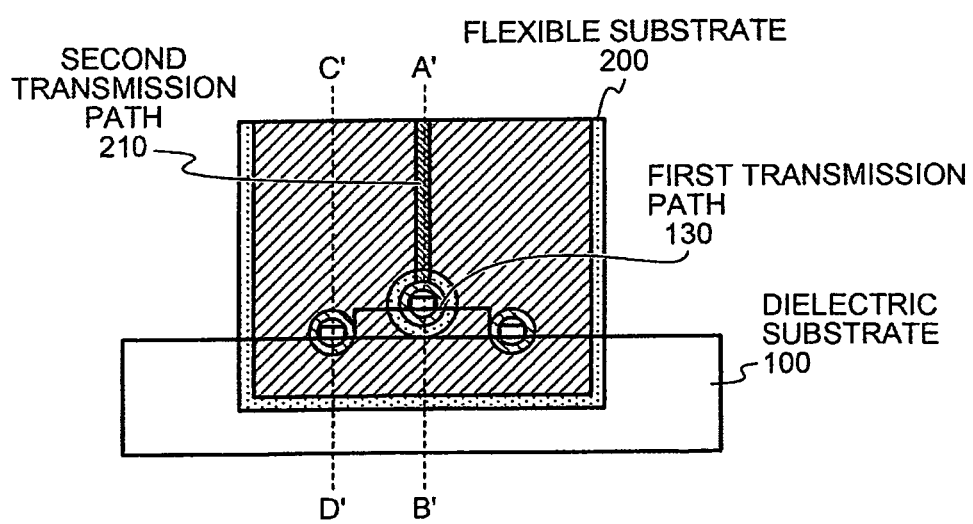
Figure 3C:
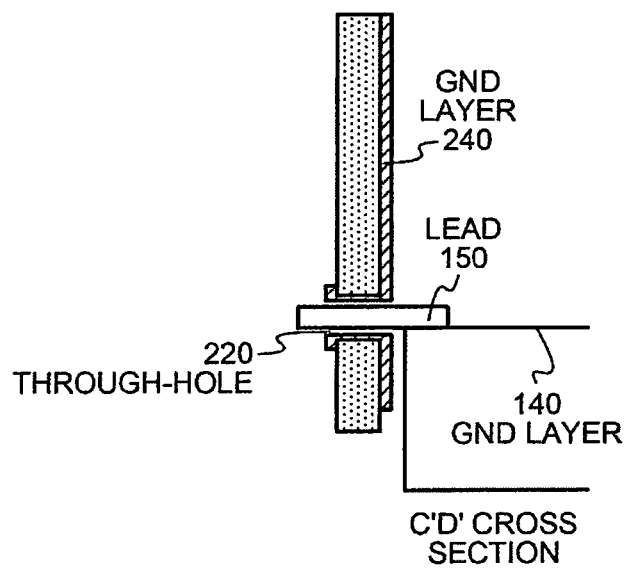
Figure 3D:
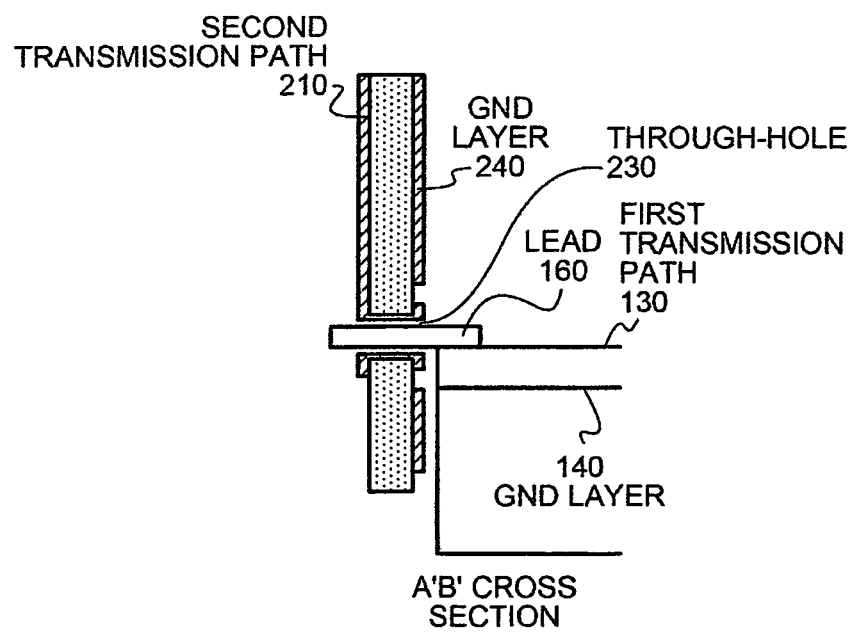

Next, it will be explained about FIGS. 3A to 3D. FIG. 3A is a perspective diagram of the connection device by which the dielectric substrate 100 and the flexible substrate 200 are connected. FIG. 3B illustrates a front view of the connection device. Furthermore, FIGS. 3C and 3D illustrate the C'D' cross section and A'B' cross section of the connection device, respectively.

Figure 4:
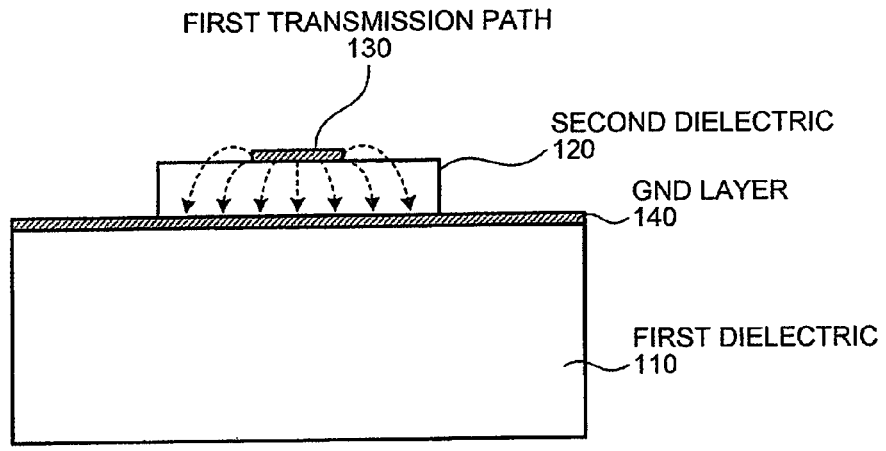
FIG. 4 is a diagram illustrating electric lines of force that are generated from a first transmission path to a GND layer.

As illustrated in FIG. 3A, the flexible substrate 200 and the dielectric substrate 100 are electrically connected by solder by respectively inserting the leads 150 and 160 into the through-holes 220 and 230. In this case, because the gap "d" (see FIG. 2D) between the signal line through-hole and the GND layer influences a high frequency characteristic, the gap "d" is set as an optimum value of about 100 micrometers. At this time, in the first transmission path 130, electric lines of force are generated toward the GND layer 140 as illustrated in FIG. 4 (FIG. 4 is a diagram illustrating electric lines of force that are generated from the first transmission path 130 to the GND layer 140). As illustrated in FIGS. 3C and 3D, according to the connection, the GND layer 140 can be connected to the GND layer 240 at the shortest.

In this way, in the connection device, the leads 150 are connected to the GND layer 140 of the dielectric substrate 100, the lead 160 is connected to the first transmission path 130, and the leads 150 and 160 are respectively inserted into the through-holes 220 and 230 provided in the flexible substrate 200 to connect the dielectric substrate 100 and the flexible substrate 200. Therefore, because the GND layer 140 for which electric lines of force generated from the first transmission path head can be connected to the GND layer 240 without interruption, a high frequency characteristic can be improved.

Figure 5:
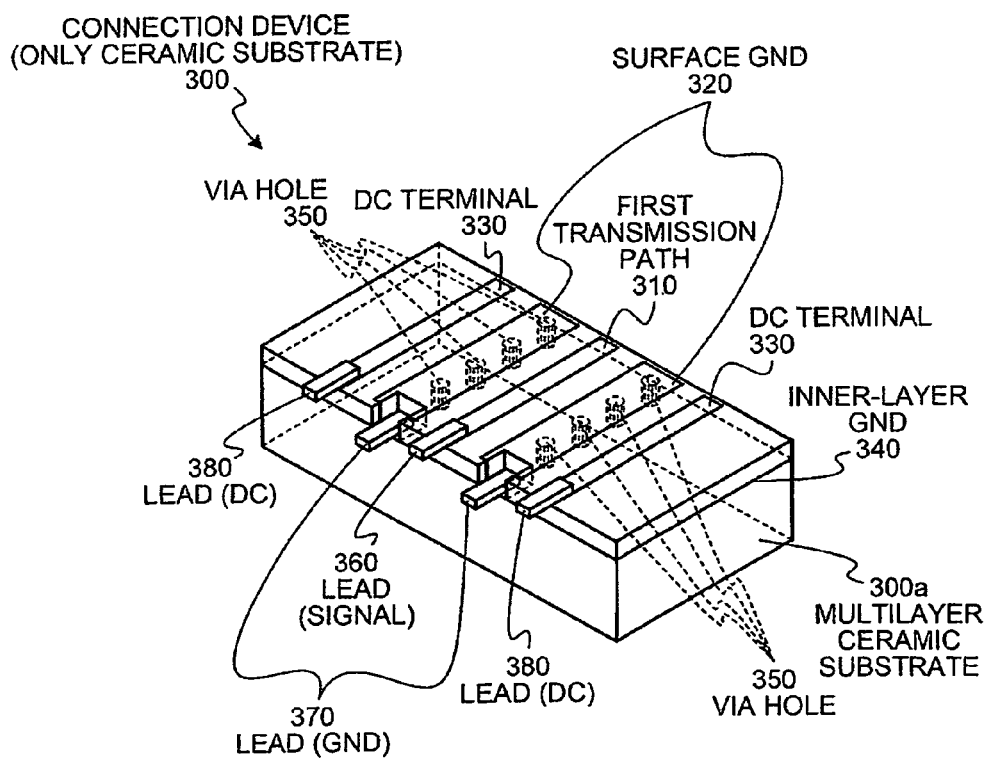
FIG. 5 is a diagram illustrating a multilayer ceramic substrate of the connection device according to the first embodiment.

Next, it is specifically explained about the configuration of the connection device according to the first embodiment. FIG. 4 is a diagram illustrating a multilayer ceramic substrate of a connection device according to the first embodiment. FIG. 5 is a diagram illustrating a connection device 300 by which the multilayer ceramic substrate and the flexible substrate are connected.

As illustrated in FIG. 5, in the connection device 300, a first transmission path (the material of the first transmission path is similar to that of the first transmission path 130 described above) 310, surface GNDs 320, and DC terminals 330 are provided as surface patterns on the top face of a multilayer ceramic substrate (dielectric or metal) 300a (a grounded coplanar line is formed), and an inner-layer GND 340 is provided in the inner layer of the multilayer ceramic substrate 300a. Furthermore, the surface GND 320 and the inner-layer GND 340 are electrically connected by via holes 350.

The impedance of a signal transmitted through the first transmission path 310 is matched between the surface GND 320 and the inner-layer GND 340. From the viewpoint of mass production, if the pitch between the surface GND 320 and the first transmission path 310 is set to a predetermined value (for example, around 0.6 mm), an impedance matching ratio between the inner-layer GND 340 and the first transmission path becomes larger than an impedance matching ratio between the surface GND 320 and the first transmission path (because electric lines of force from the first transmission path 310 are thickly generated toward the inner-layer GND 340). Therefore, a high-frequency signal transmitted through the first transmission path 310 is conspicuously influenced by the impedance mismatching of the inner-layer GND 340.

A lead 360 is connected to the top face of the first transmission path 310, leads 370 are connected to the top face of the inner-layer GND 340, and leads 380 are connected to the top faces of the DC terminals 330. A method for connecting the leads 360 to 380 to the top faces may be realized by any well-known art. For example, the connection method can be realized by silver solder.

As illustrated in FIG. 5, when the leads 370 are connected to the inner-layer GND 340, the face of the multilayer ceramic substrate 300a that is located at the surface GND 320 is cut up to the inner-layer GND 340 (to expose the inner-layer GND 340), and the leads 370 are directly connected to the inner-layer GND 340. In this case, the side face of the cut portion of the multilayer ceramic substrate 300a may be plated (may be metalized).

Figure 6A:
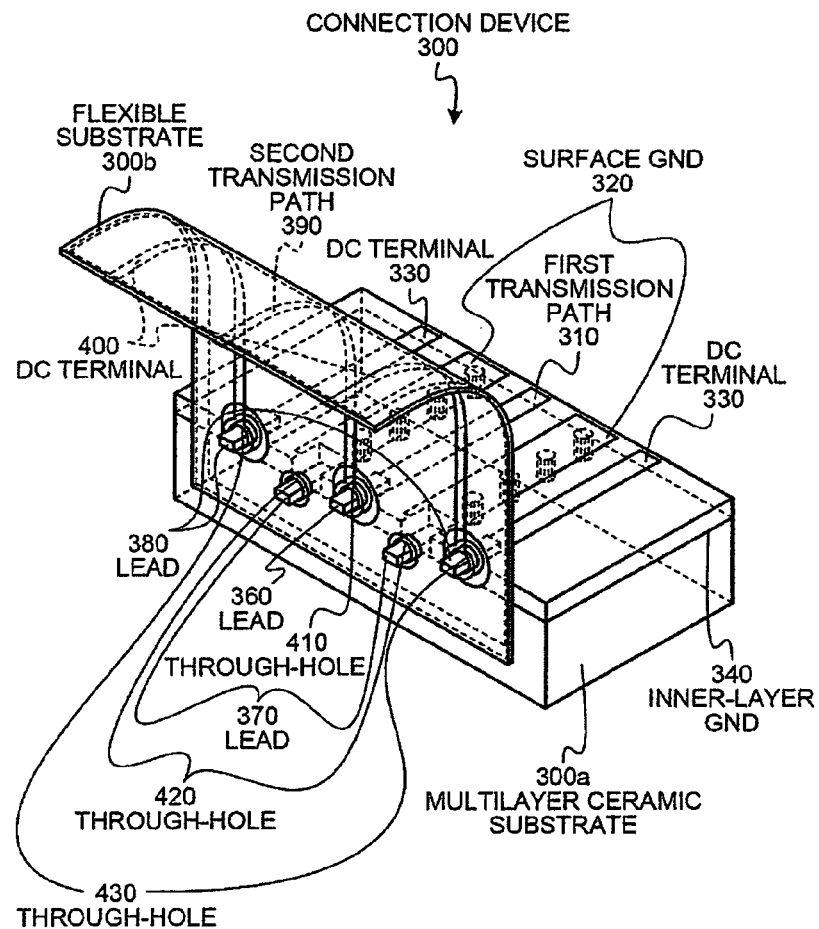
FIGS. 6A to 6E are diagrams illustrating the connection device by which a ceramic substrate and a flexible substrate are connected.
Figure 6B:
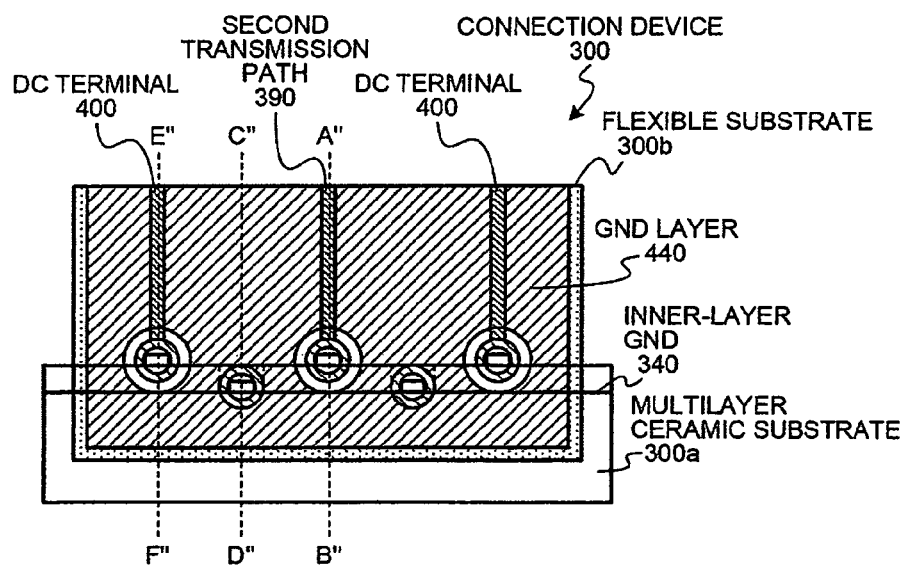
Figure 6C:
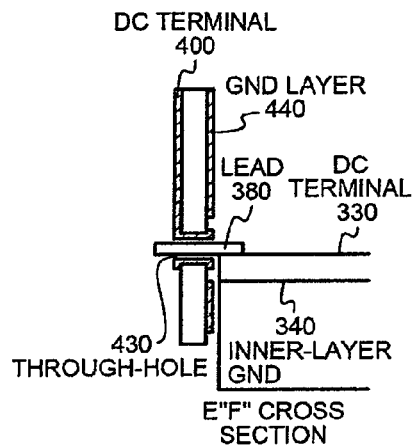
Figure 6D:
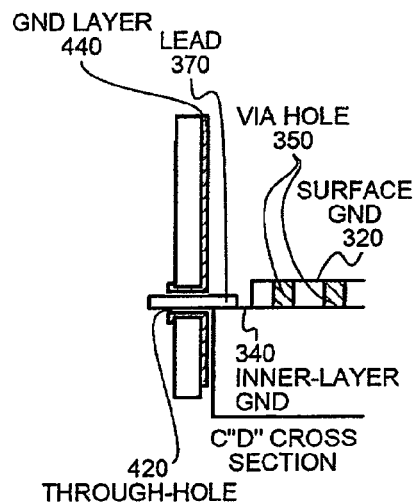
Figure 6E:
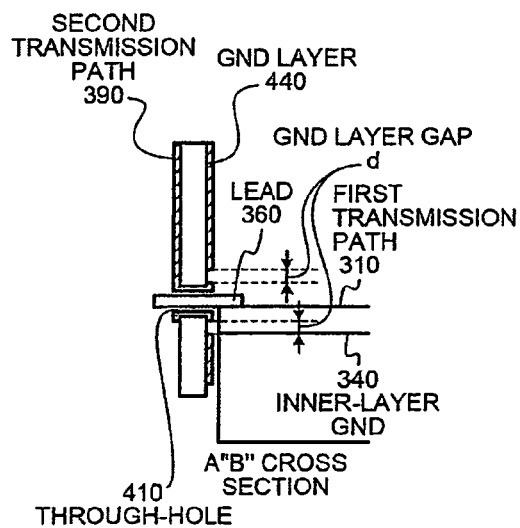

Next, it will be explained about FIGS. 6A to 6E. FIG. 6A is a perspective diagram of the connection device 300 by which the multilayer ceramic substrate 300a and a flexible substrate 300b are connected. FIG. 6B illustrates a front view of the connection device 300. Furthermore, FIGS. 6C to 6E illustrate the A"B" cross section, C"D"cross section, and E"F" cross section of the connection device 300, respectively.

As illustrated in FIG. 6A, the multilayer ceramic substrate 300a and the flexible substrate 300b are connected by respectively inserting the leads 360 to 380 into through-holes 410 to 430. Furthermore, after the leads 360 to 380 are respectively inserted into the through-holes 410 to 430, they are connected by solder.

In other words, the first transmission path 310 and the second transmission path are electrically connected by the lead 360, the surface GND 320 and a GND layer 440 are electrically connected by the leads 370, and the DC terminals 330 and DC terminals 400 are electrically connected by the leads 380.

A second transmission path (the material of the second transmission path is similar to that of the second transmission path 210 described above) 390, a DC terminals 400, the through-hole 410 into which the lead 360 is inserted, the through-holes 420 into which the leads 370 are inserted, and the through-holes 430 into which the leads 380 are inserted are provided in the flexible substrate 300b.

As illustrated in FIG. 6B, the GND layer 440 is provided on the surface of the flexible substrate 300b. The GND layer 440 is provided on the opposite face of a face on which the second transmission path 390 is provided. Moreover, the inside of the through-hole 410 is electrically connected to the second transmission path 390 (see FIG. 6E), the inside of each the through-hole 420 is electrically connected to the GND layer 440 (see FIG. 6D), and the inside of each the through-hole 430 is electrically connected to the DC terminal 400 (see FIG. 6C).

The DC terminals 330 and the DC terminals 400 are connected to each other by inserting the leads 380 into the through-holes 430 (see FIG. 6C). Moreover, the inner-layer GND 340 and the GND layer 440 are connected to each other by inserting the leads 370 into the through-holes 420 (see FIG. 6D).

In this case, because the inner-layer GND 340 and the GND layer 440 are coupled (electrically connected) without interruption, the occurrence of impedance mismatch can be prevented and thus the degradation of a high-frequency signal transmitted through the first transmission path 310 and the second transmission path 390 can be prevented. Moreover, the first transmission path 310 and the second transmission path 390 are electrically connected by inserting the lead 360 into the through-hole 410 (see FIG. 6E). Moreover, in the A"B" cross section, the gap "d" of the GND layer becomes 30 micrometers to 150 micrometers, and thus an influence on a high frequency characteristic is prevented.

Figure 7A:
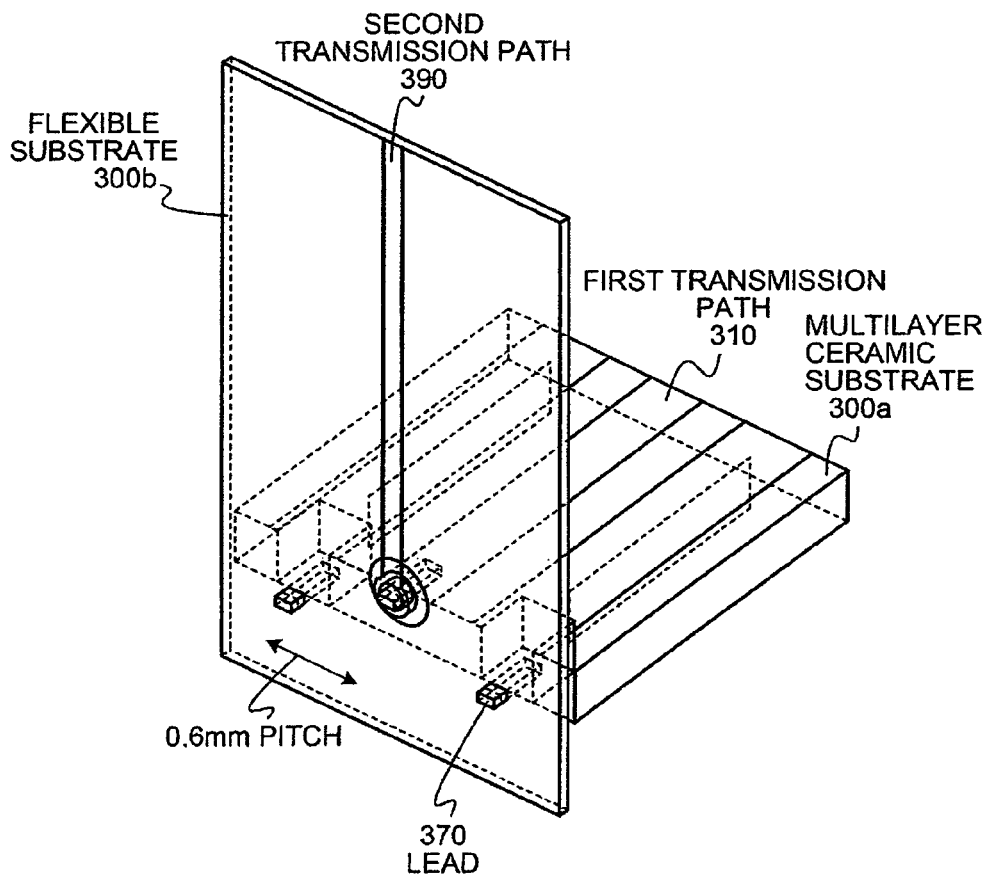
FIGS. 7A and 7B are diagrams illustrating the frequency characteristic of the connection device according to the first embodiment.
Figure 7B:
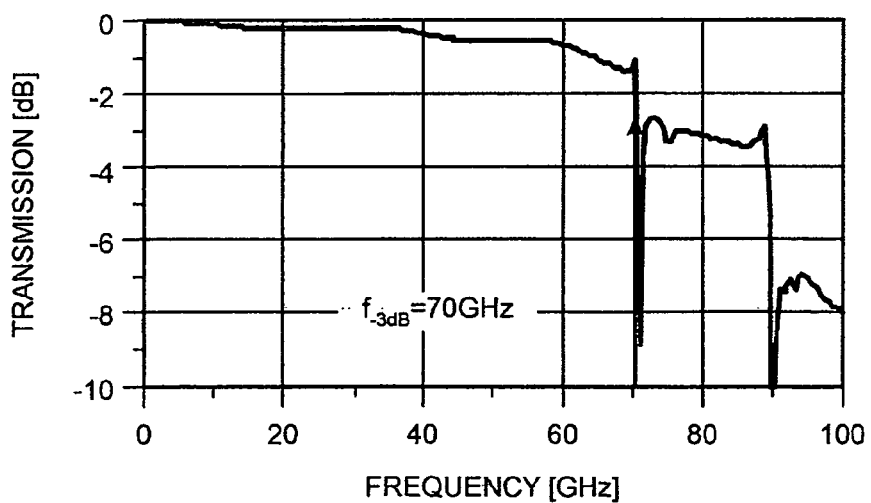

Next, it will be explained about the frequency characteristic of the connection device 300 according to the first embodiment. FIG. 7B is a diagram illustrating the frequency characteristic of the connection device 300 according to the first embodiment. In this case, because FIG. 7A is a schematic drawing of the connection device 300 illustrated in FIG. 6A, the same reference numbers are given and their descriptions are omitted.

As illustrated in FIG. 7B, when the frequency of a signal that is transmitted through the first transmission path 310 becomes more than or equal to 70 GHz, transmission becomes −3 [dB]. In other words, a high-frequency signal up to 70 GHz can be transmitted without degradation by using the connection device 300 according to the first embodiment.

As described above, in the connection device 300 according to the first embodiment, the lead 370s are connected to the inner-layer GND 340, the lead 360 is connected to the first transmission path 310, and the leads 360 and 370 are respectively inserted into the through-holes 410 and 420 provided in the flexible substrate 300b to connect the multilayer ceramic substrate 300a and the flexible substrate 300b. Therefore, because the GND layer 340 for which electric lines of force generated from the first transmission path 310 head can be connected to the GND layer 440 without interruption, a high frequency characteristic can be improved.

Moreover, in the connection device 300 according to the first embodiment, because the leads 360 to 380 are respectively fitted and connected into the through-holes 410 to 430 by soldering, connection workability of the multilayer ceramic substrate 300a and the flexible substrate 300b can be improved.

Moreover, in the connection device 300 according to the first embodiment, because the pitch between the first transmission path 310 and the surface GND 320 can be around 0.6 mm, a technology for positioning connection patterns with high accuracy becomes unnecessary and thus mass production can be improved.

[b] Second Embodiment

It has been explained about the embodiment of the present invention till now. However, the present invention may be realized by various different configurations in addition to the first embodiment described above. Hereinafter, it will be explained about another embodiment of the present invention as the second embodiment.

(1) Multilayer Flexible Substrate

Figure 8A:
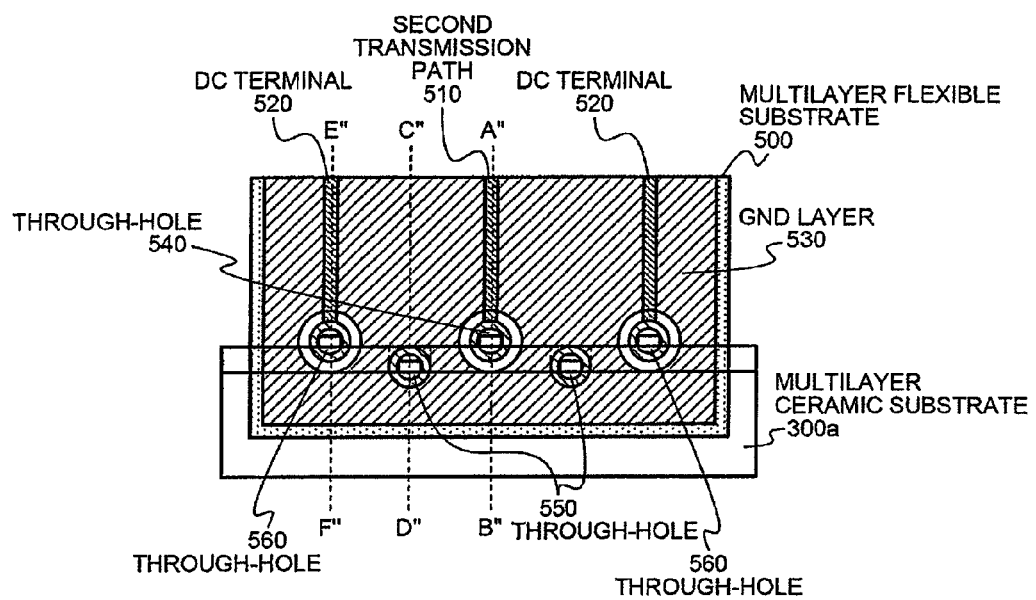
FIGS. 8A to 8D are diagrams illustrating the connection device in which the multilayer ceramic substrate illustrated in FIG. 5 is connected to a multilayer flexible substrate.
Figure 8B:
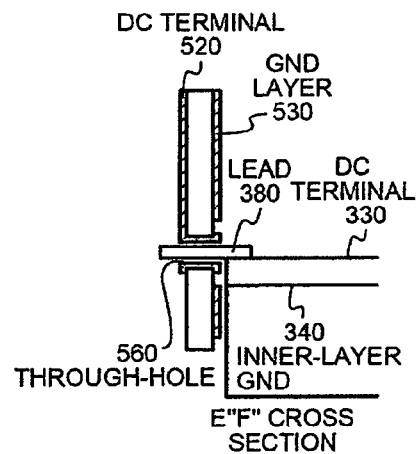
Figure 8C:
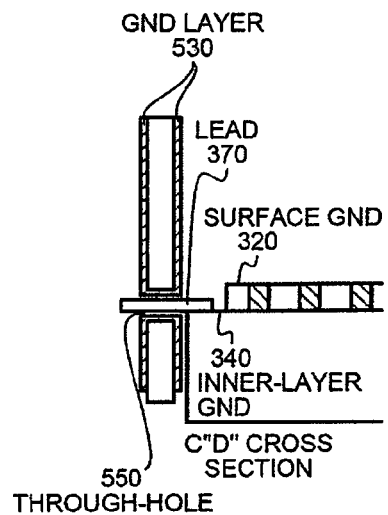
Figure 8D:
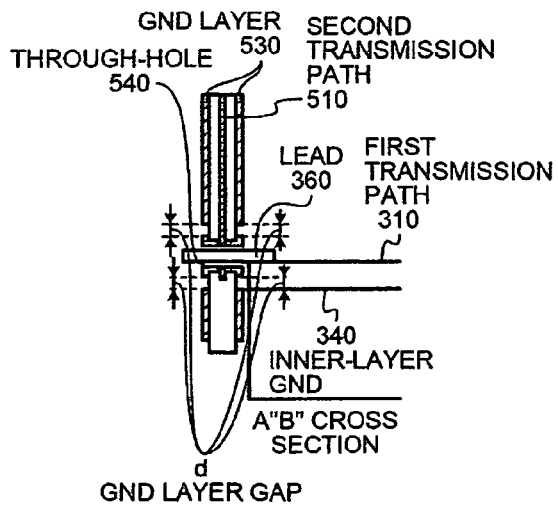

A connection device according to the present invention can use a multilayer flexible substrate. When a multilayer flexible substrate is used, the number of wiring layers increases. Therefore, the degrees of freedom of electric wiring can be increased. FIGS. 8A to 8D are diagrams illustrating a connection device in which the multilayer ceramic substrate 300a illustrated in FIG. 5 is connected to a multilayer flexible substrate 500. FIG. 8A illustrates a front view of the connection device. FIGS. 8B to 8D illustrate the A"B" cross section, C"D" cross section, and E"F" cross section of the connection device, respectively.

As illustrated in FIG. 8A, the multilayer flexible substrate 500 includes a second transmission path 510, DC terminals 520, a GND layer 530, and through-holes 540 to 560. As illustrated in FIGS. 8B to 8D, the second transmission path 510 is provided in the inner layer of the multilayer flexible substrate 500 (see the A"B" cross section) and the GND layer 530 is provided at both sides of the multilayer flexible substrate 500 to sandwich the second transmission path 510 (the second transmission path 510 is sandwiched by the GND layer 530 via a dielectric layer).

The inside of the through-hole 540 is electrically connected to the second transmission path 510 (see FIG. 8D), the inside of each a through-hole 550 is electrically connected to the GND layer 530 (see FIG. 8C), and the inside of each the through-hole 560 is electrically connected to the DC terminal 520 (see FIG. 8B).

In this case, because the inner-layer GND 340 and the GND layer 530 are coupled (are electrically connected) without interruption, the occurrence of impedance mismatch can be prevented and thus the degradation of a high-frequency signal that is transmitted through the first transmission path 310 and the second transmission path 510 can be prevented. Moreover, the first transmission path 310 and the second transmission path 510 are electrically connected by inserting the lead 360 into the through-hole 540 (see FIG. 8D). In this case, the gap "d" between the through-hole 540 and the GND layer 530 is set to 30 to 150 micrometers because the gap influences a high frequency characteristic.

Furthermore, as illustrated in FIG. 8A, because the second transmission path 510 through which a high-frequency signal is transmitted is sandwiched by the GND layer 530, an influence on the periphery (housing of module or the like) can be reduced and a short can be prevented.

(2) Application to Various Devices

The connection device according to the first embodiment can be applied to various devices of an optical transceiver (pluggable module or the like). FIG. 9 is an example illustrating the configuration of an optical transceiver 600. As illustrated in FIG. 9, the optical transceiver 600 includes light receptacles 620, a ROSA 630a, a TOSA 630b, optical component terminals 640, flexible substrates 650, a printed circuit board 660, an electricity input unit 670, CDRs (Clock and Data Recovery) 680, and a driver amplifier 690. The connection device 300 according to the first embodiment is applied to a connection unit 700.

Figure 10:
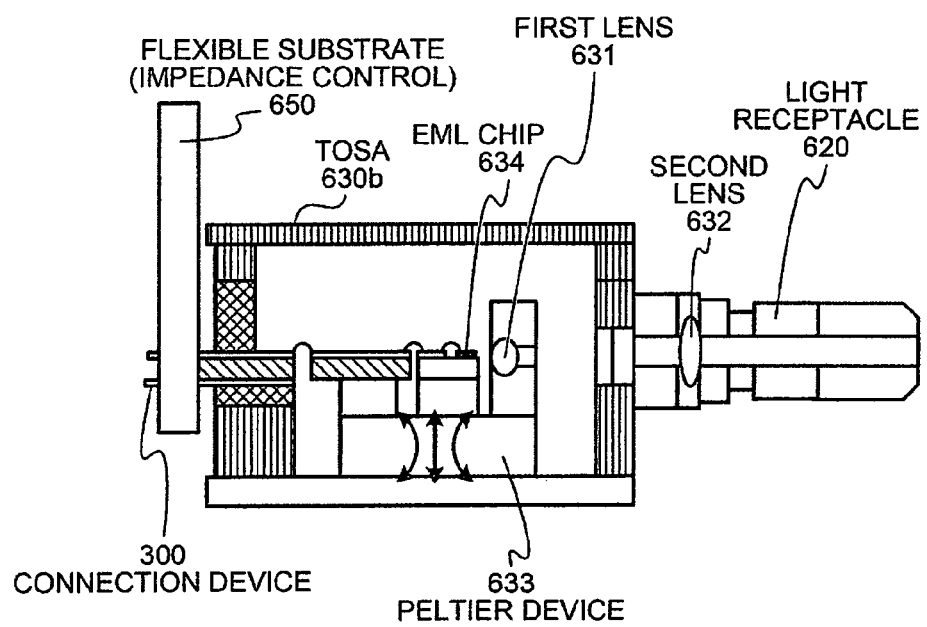
FIG. 10 is a diagram illustrating an example of a connection unit.
Figure 11:
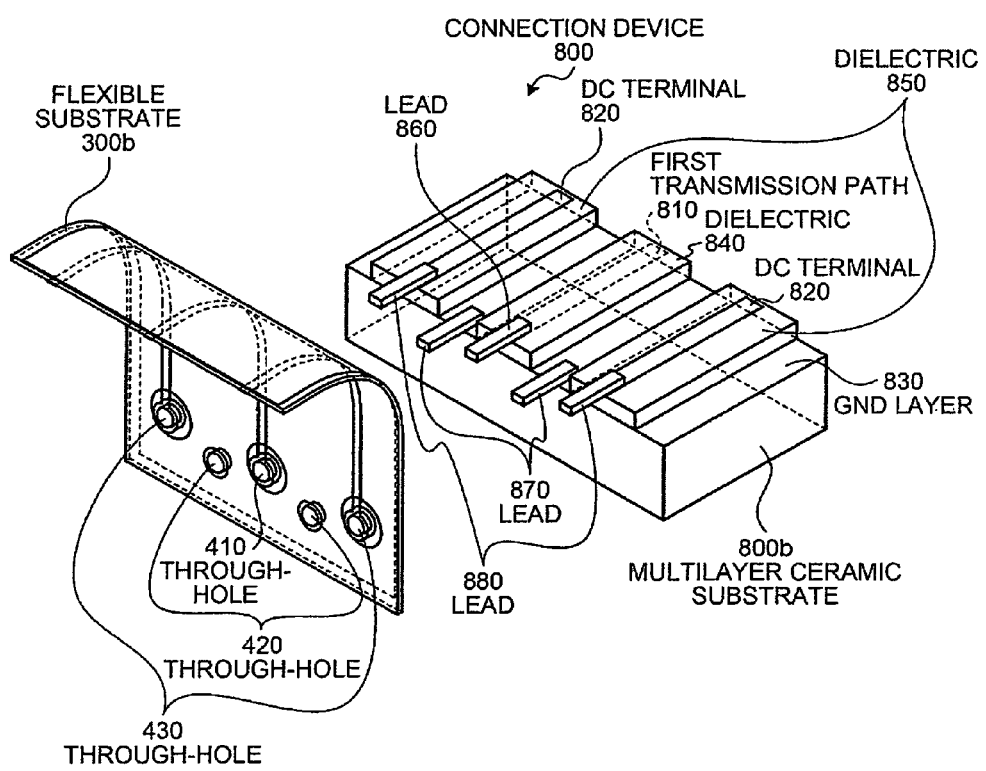
FIG. 11 is a diagram illustrating the other configuration of the connection device.

FIG. 10 is a diagram illustrating an example of the connection unit 700. In an example illustrated in FIG. 10, an example of applying the connection device to the TOSA 630b is illustrated. As illustrated in FIG. 10, the TOSA 630b includes a first lens 631, a second lens 632, a Peltier device 633, an EML chip the 634, and the like, and converts an electrical signal transmitted from the first transmission path (see FIGS. 5 and 6) of the connection device into an optical signal.

In FIG. 9, because the light receptacles 620, the ROSA 630a, the optical component terminals 640, the flexible substrates 650, and the printed circuit board 660 are similar to the light receptacles 12, the ROSA 13a, the TOSA 13b, the optical component terminals 14, the flexible substrates 15, and the printed circuit board 16, which are illustrated in FIG. 16, their descriptions are omitted.

When the optical transceiver is inserted into the port (not illustrated) of an optical communication system, the electricity input unit 670 is a means for transmitting and receives an electrical signal to and from the port of the optical communication system. The CDR 680 is a means for extracting a data signal and a clock signal from the electrical signal input from the electricity input unit 670 and outputs the signals to the driver amplifier. The driver amplifier 690 is an amplifier that outputs a driving signal for driving the TOSA 630b to the TOSA 630b on the basis of the electrical signal output from the CDR 680.

In this way, the degradation of a high-frequency signal can be prevented by applying the connection device 300 (see FIGS. 4 and 5) according to the first embodiment to the connection unit 700. Even if a signal for transmission and reception is a high-frequency signal, the optical transceiver 600 can be used for the transmission and reception of a signal.

(3) Another Configuration of Connection Device

The configuration of the connection device is not limited to the connection device 300. FIGS. 11 to 14 are diagrams illustrating the other configuration of a connection device. In a connection device 800 illustrated in FIG. 11, a dielectric 840 on which a first transmission path 810 is provided and dielectrics 850 on which DC terminals 820 are provided are coupled to a GND layer 830 of a multilayer ceramic substrate 800b, and leads 870 are connected to the exposed portions of the GND layer 830 that are located between the dielectric 840 and the dielectrics 850.

Moreover, a lead 860 is connected to the first transmission path 810 and leads 880 are connected to the DC terminals 820. The leads 860, 870, and 880 are inserted into the through-holes 410, 420, and 430 of the flexible substrate 300b to be electrically connected by solder (the flexible substrate 300b is similar to that of FIG. 6).

Figure 12:
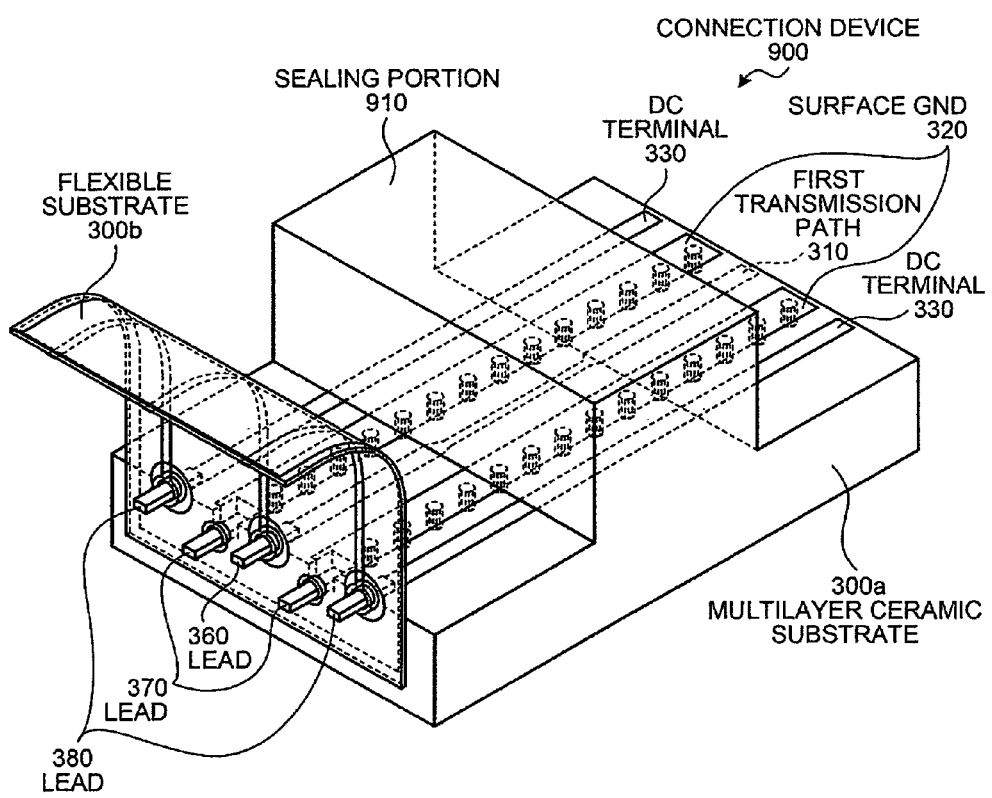
FIG. 12 is a diagram illustrating the other configuration of the connection device.

A connection device 900 of FIG. 12 includes a sealing portion 910 on the top face of the multilayer ceramic substrate 300a of FIG. 5. The sealing portion 910 is used when the optical device and the connection device 900 are fitted. Moreover, because the surface of the sealing portion 910 is plated, a fitting unit is connected by Au—Sn solder to be able to seal up the inside of the optical device when the optical device and the sealing portion 910 are fitted. FIG. 15 is a diagram illustrating an example of connecting the connection device 900 including the sealing portion 910 to the optical device (for example, the TOSA 630b). In this case, the connection device 900 may include the other electric wiring on the multilayer ceramic substrate 300a.

Figure 13:
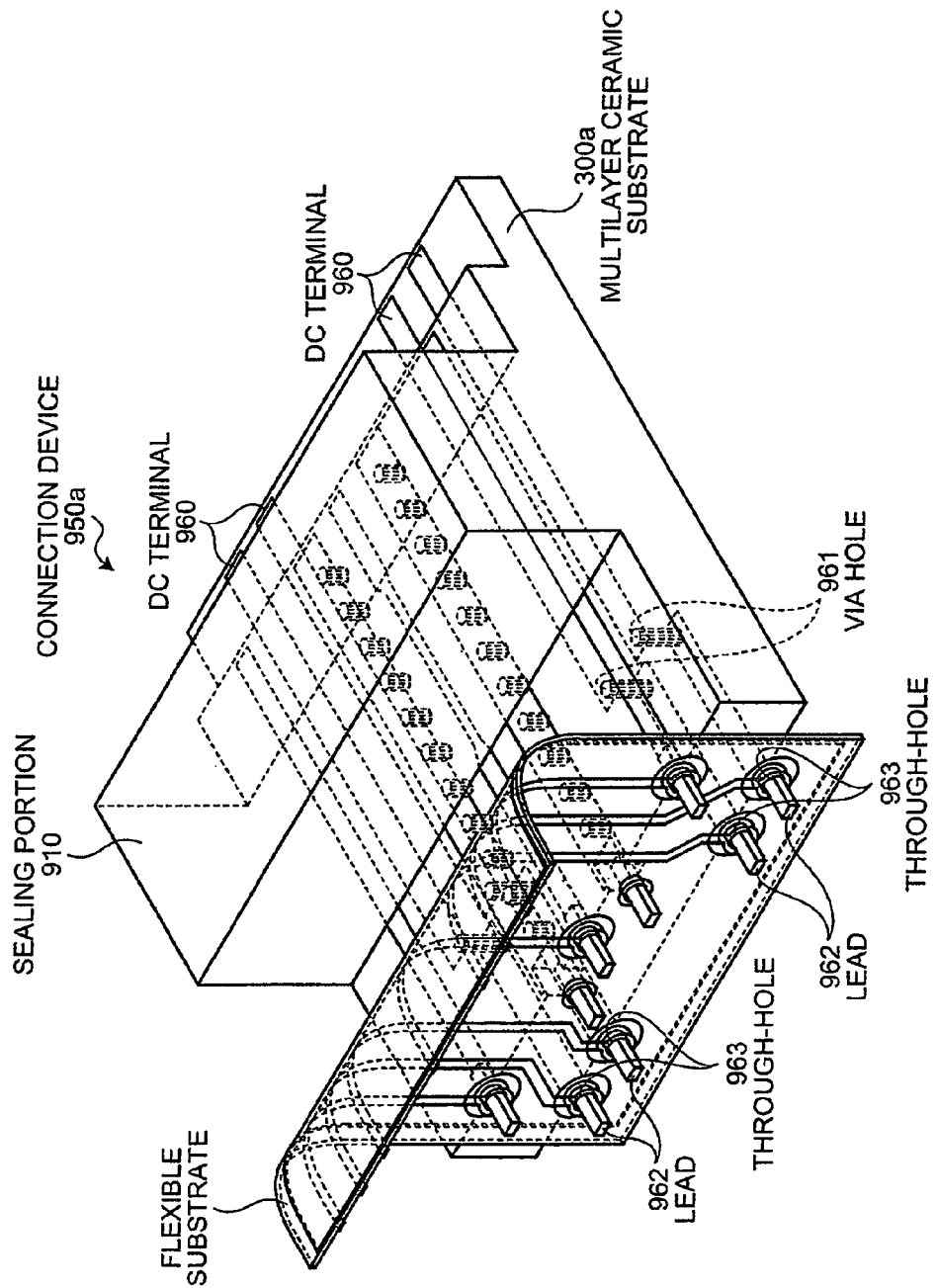
FIG. 13 is a diagram illustrating the other configuration of the connection device.
Figure 14:
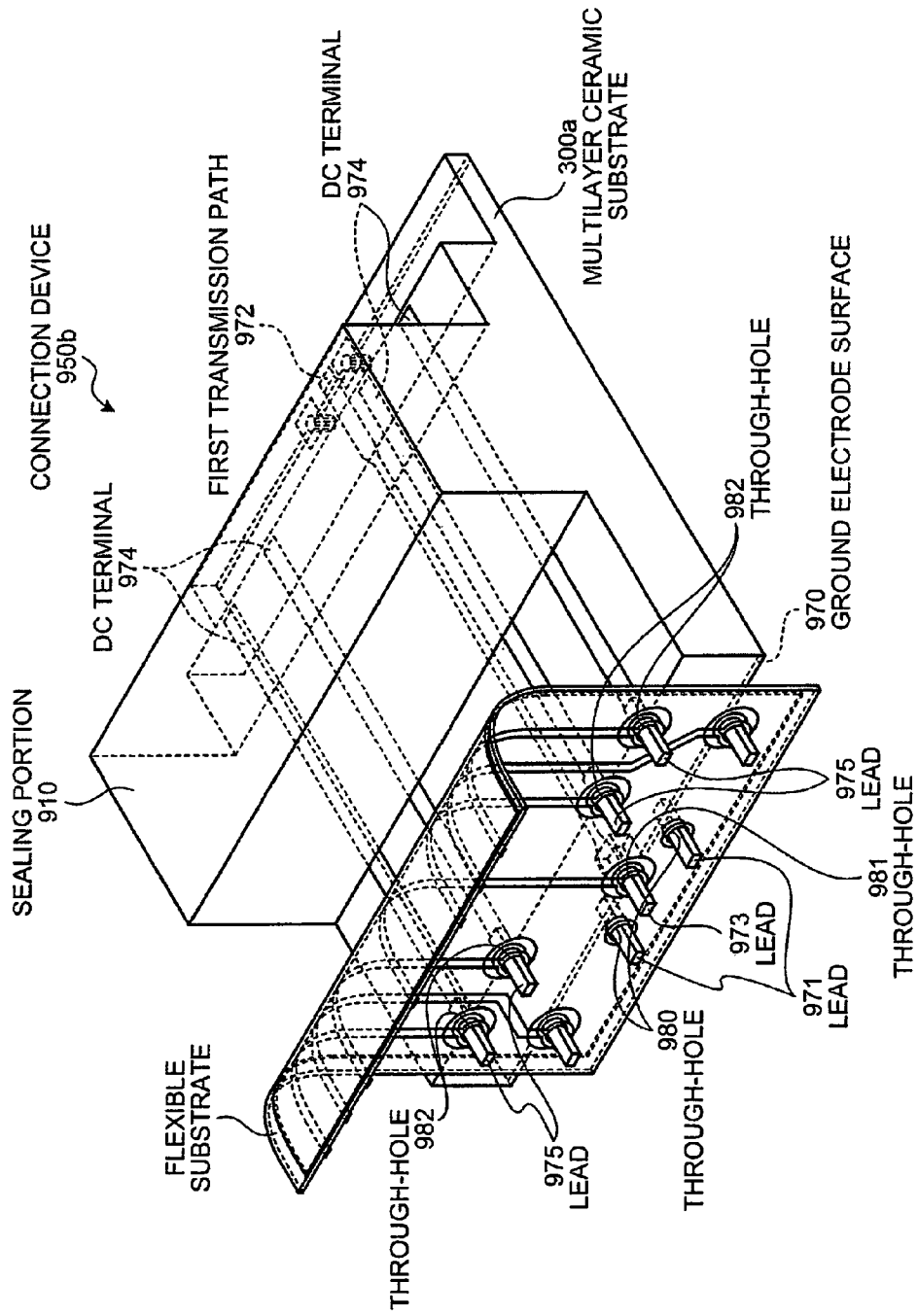
FIG. 14 is a diagram illustrating the other configuration of the connection device.
Figure 17:
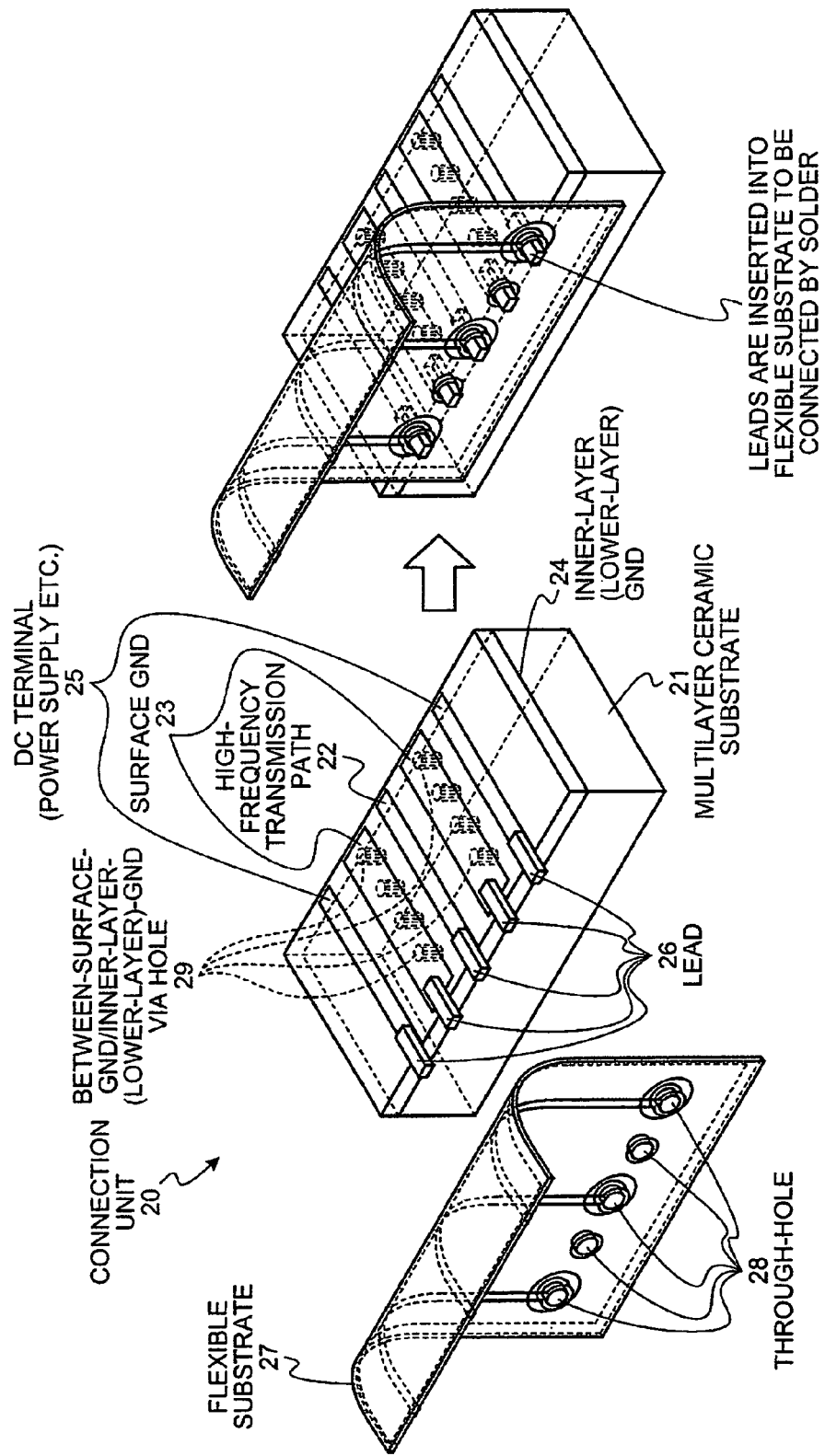
FIG. 17 is a diagram illustrating the configuration of a conventional connection unit.
Figure 18:
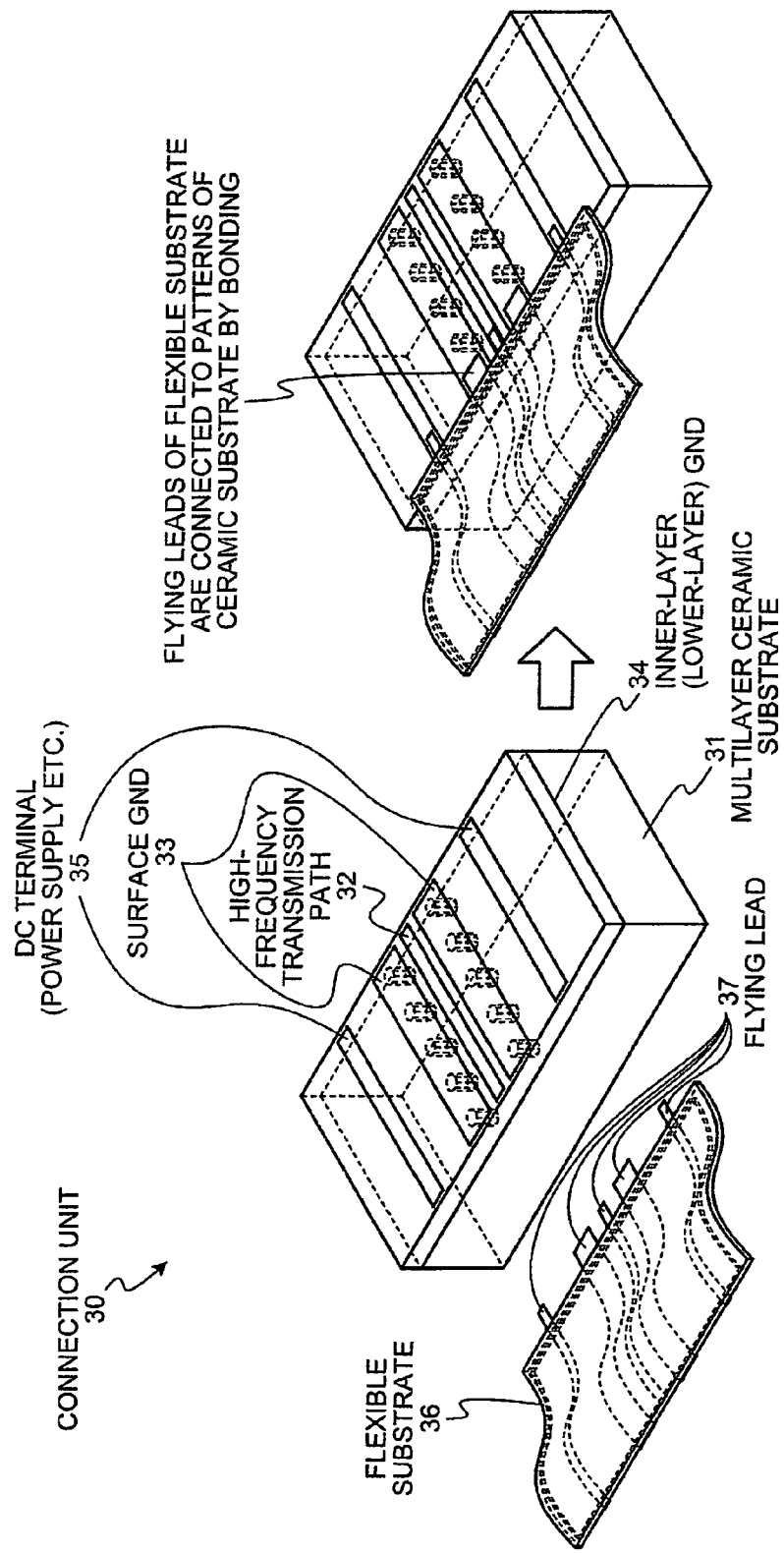
FIG. 18 is a diagram illustrating the configuration of the conventional connection unit.
Figure 19:
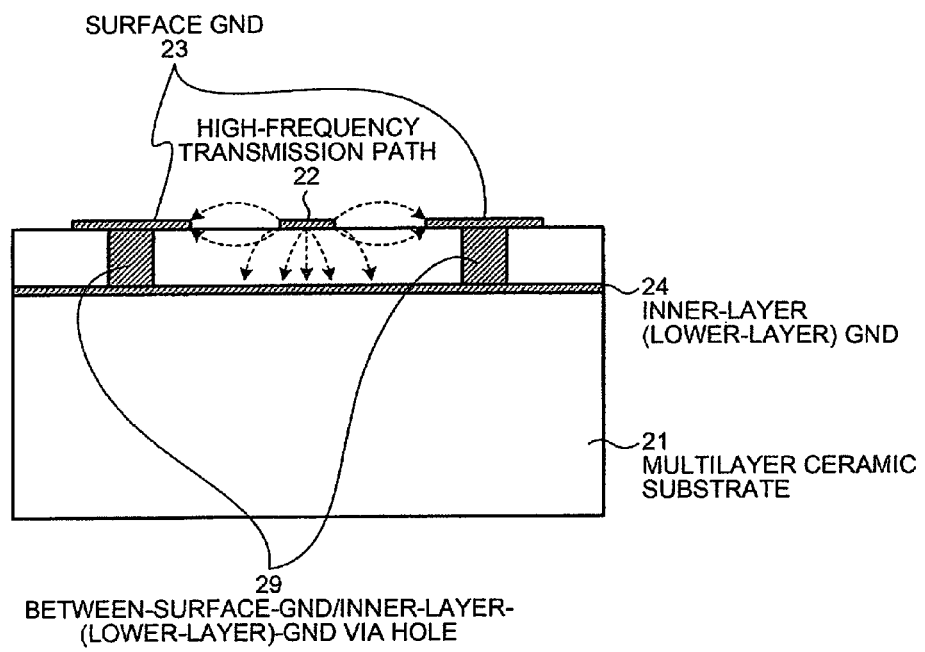
FIG. 19 is a cross-sectional view of a high-frequency transmission path of FIG. 17 and is a diagram illustrating electric lines of force between a signal line and GNDs.
Figure 20:
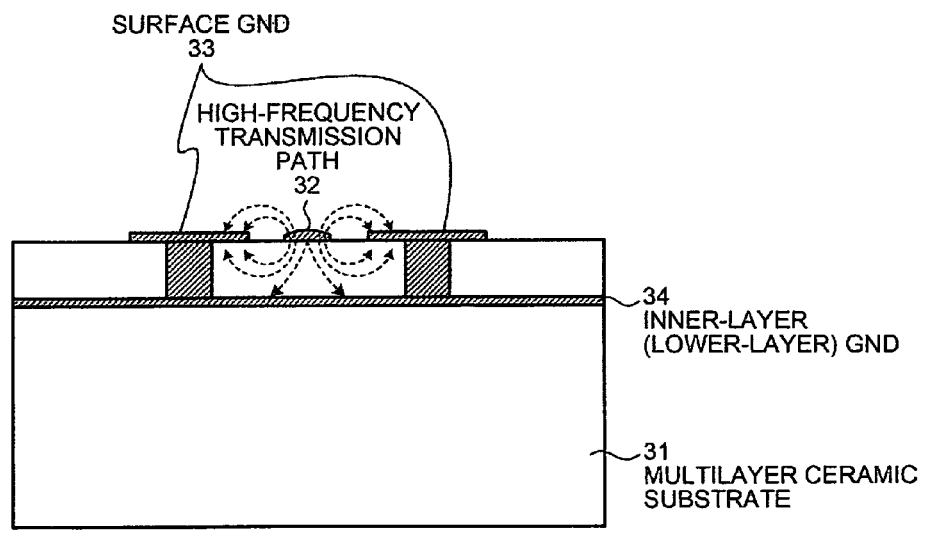
FIG. 20 is a cross-sectional view of the high-frequency transmission path of FIG. 18 and is a diagram illustrating electric lines of force between the signal line and GNDs.

Each of connection devices 950a and 950b illustrated in FIGS. 13 and 14 includes wiring layers at the both sides of the multilayer ceramic substrate 300a. In the connection device 950a illustrated in FIG. 13, DC terminals 960 starts from the front face (face to which the sealing portion 910 is connected) of the multilayer ceramic substrate 300a, passes through the inside, and arrives at the rear face through via holes 961 to be connected to leads 962. Moreover, the leads 962 are inserted into through-holes 963 provided in the flexible substrate to be connected by solder (the other configuration is similar to that of the connection device 900 illustrated in FIG. 12).

The connection device 950b illustrated in FIG. 14 includes a ground electrode surface 970 at the rear side of the multilayer ceramic substrate 300a, and leads 971 are connected to the ground electrode surface 970. In this case, the leads 971 are inserted into through-holes 980 of the flexible substrate to be connected by solder. Moreover, a first transmission path 972 passes through the inner layer of the multilayer ceramic substrate 300a and is connected to a lead 973. In this case, the lead 973 is inserted into the through-hole 981 of the flexible substrate to be connected by solder. Moreover, DC terminals 974 pass through the inner layer of the multilayer ceramic substrate 300a and are connected to leads 975. In this case, the leads 975 are inserted into through-holes 982 of the flexible substrate to be connected by solder.

In this way, in the connection devices 800, 900, 950a, and 950b illustrated in FIGS. 11 to 14, because the GND layer for which electric lines of force generated from the first transmission path head can be connected to the GND layer of the flexible substrate without interruption, a high frequency characteristic can be improved. Moreover, because the connection devices 900, 950a, and 950b illustrated in FIGS. 12 to 14 include the sealing portion 910, the connection devices can be easily connected with another optical device (for example, ROSA or TOSA) and the inside of each the device can be sealed up.

In the meantime, among the processes described in the first and second embodiments, the whole or a part of processes that have been automatically performed can be manually performed. Alternatively, the whole or a part of processes that have been manually performed can be automatically performed in a well-known method. Moreover, the multilayer ceramic substrate 300a that includes various types of electric wiring of the connection device can be formed from a dielectric multilayer substrate in block by a well-known technology.

Moreover, the connection device and the optical device described in the first and second embodiments are a functional concept. Therefore, these devices are not necessarily constituted physically as illustrated in the drawings. In other words, the specific configuration of dispersion/integration of each device is not limited to the illustrated configuration. Therefore, all or a part of each device can dispersed or integrated functionally or physically in an optional unit in accordance with various types of loads or operating conditions.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A connection device comprising:
a ground electrode layer that is provided in a substrate;
a first transmission path that is provided on the ground electrode layer via a dielectric layer;
a plurality of leads, a first lead among the plurality of leads being connected to the first transmission path and a second lead among the plurality of leads being connected to the ground electrode layer or the first lead being connected to the first transmission path and the second lead being connected to a plane that is electrically connected to the ground electrode layer; and
a flexible substrate that is provided with a second transmission path and a ground electrode, a first through-hole being formed in the second transmission path and a second through-hole being formed in the ground electrode, wherein
the first lead is fitted into the first through-hole and the second lead is fitted into the second through-hole to be electrically connected.

2. The connection device according to claim 1, further comprising a plurality of lines other than the first transmission path on the dielectric layer, wherein
the lines are respectively connected to third leads, and
the third leads connected to the lines are fitted into third through-holes provided in the flexible substrate to be electrically connected.

3. The connection device according to claim 2, wherein
an area of a second ground electrode layer provided under the ground electrode layer is exposed by cutting up both ends of the substrate with the first transmission path being sandwiched between the both ends in the substrate on which the first transmission path is formed, and
the second lead is connected to the exposed second ground electrode layer.

4. The connection device according to claim 3, wherein the substrate on which the first transmission path is formed and the plane electrically connected to the ground electrode layer are integrally formed from a dielectric multilayer substrate.

5. The connection device according to claim 4, wherein
a grounded coplanar line having surface ground electrodes is formed on the substrate, the surface ground electrodes being provided at both sides of the first transmission path on a same face as that of the first transmission path with the first transmission path being sandwiched between the electrodes, the surface ground electrodes being electrically connected to the ground electrode layer that is provided via the dielectric layer.

6. The connection device according to claim 4, wherein the dielectric multilayer substrate is a ceramic multilayer substrate.

7. The connection device according to claim 5, wherein
the dielectric multilayer substrate is a ceramic multilayer substrate,
the surface ground electrode is cut up at the end of the substrate in the grounded coplanar line on the ceramic multilayer substrate, and
the surface ground electrode and the ground electrode layer electrically connected via the dielectric are electrically connected in a lateral side of the cut portion.

8. The connection device according to claim 7, wherein the second transmission path is provided on a first face of the flexible substrate and the ground electrode being provided on a second face of the flexible substrate opposite to the first face.

9. The connection device according to claim 8, wherein the first, second and third leads are inserted and fitted into the through-holes from the side of the ground electrode of the flexible substrate to be electrically connected.

10. The connection device according to claim 9, wherein the second transmission path extends from the first face via the first through-hole to the second face to form a land on the second face, and a gap between the land and the ground electrode layer is 30 to 150 micrometers.

11. The connection device according to claim 10, wherein a material of the flexible substrate includes liquid crystal polymer.

12. The connection device according to claim 11, wherein a material of the flexible substrate includes polyimide.

13. The connection device according to claim 12, wherein at least one of the first face and the second face of the flexible substrate has an insulating layer.

14. The connection device according to claim 13, further comprising a sealing portion that is fitted with another device and seals a fitted portion.

15. An optical device for transmitting an optical signal, comprising:
the connection device according to claim 1; and
a transmitting unit that transmits the optical signal to an outside by controlling a laser based on an electrical signal that is transmitted through the connection device.

16. An optical device for receiving an optical signal, comprising:
the connection device according to claim 1; and
a receiving unit that converts the optical signal received from an outside into an electrical signal and then outputs the electrical signal to the connection device.

17. An optical device for transmitting and receiving an optical signal, comprising:
the connection device according to claim 1;
a transmitting unit that transmits the optical signal to an outside by controlling a laser based on an electrical signal that is transmitted through the connection device; and
an output unit that converts the optical signal received from the outside into an electrical signal and then outputs the electrical signal to the connection device.

18. A connection device comprising:
a ground electrode layer that is provided in a substrate;
a first transmission path that is provided on the ground electrode layer via a dielectric layer;
a plurality of lines provided on the ground electrode layer via the dielectric layer;
a plurality of leads connected to the first transmission path and the lines, and fitted into through-holes provided in a second path and a terminal on a flexible substrate to be electrically connected;
an area of the ground electrode layer is exposed with the first transmission path being sandwiched between the exposed area; and
a plurality of second leads connected to the exposed area of the ground electrode layer, and fitted into through-holes provided in a ground electrode on the flexible substrate to be electrically connected.

* * * * *